Figure 1:
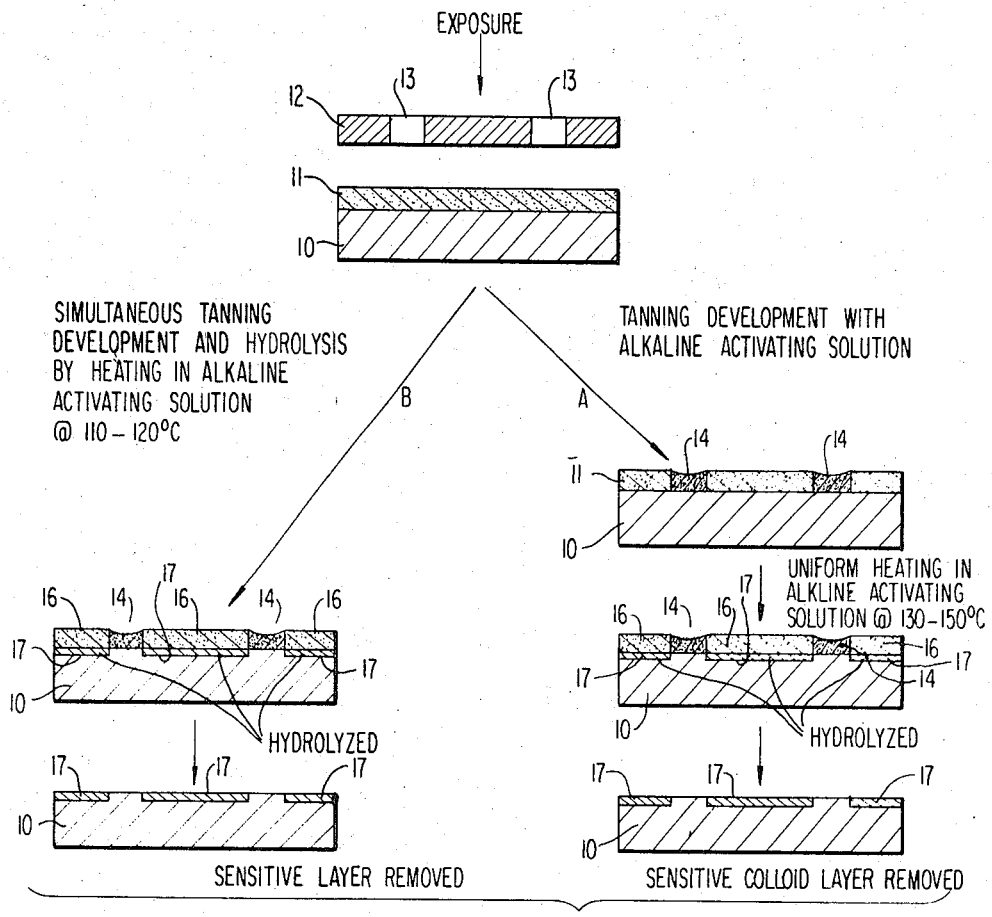
Figure 2:
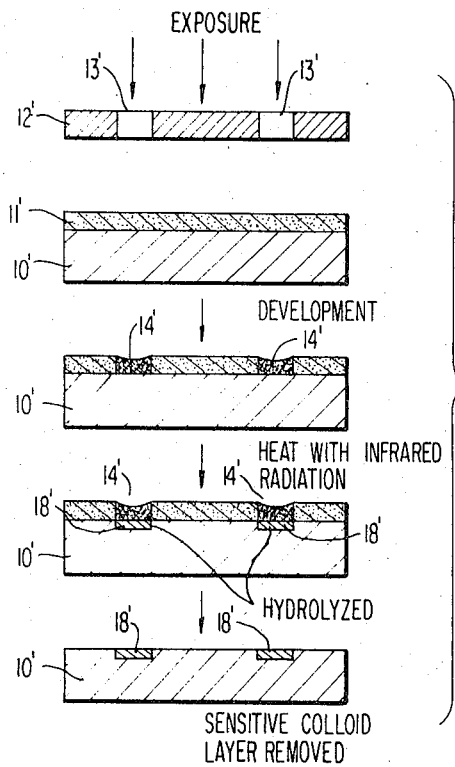

DEFENSIVE PUBLICATION

UNITED STATES PATENT OFFICE

Published at the request of the applicant or owner in accordance with the Notice of Dec. 16, 1969, 869 O.G. 687. The abstracts of Defensive Publication applications are identified by distinctly numbered series and are arranged chronologically. The heading of each abstract indicates the number of pages of specification, including claims and sheets of drawings contained in the application as originally filed. The files of these applications are available to the public for inspection and reproduction may be purchased for 30 cents a sheet.

Defensive Publication applications have not been examined as to the merits of alleged invention. The Patent Office makes no assertion as to the novelty of the disclosed subject matter.

PUBLISHED JANUARY 26, 1971

882 O.G. 1347

T882,023

METHOD OF MAKING A HYDROLYZED CELLULOSE ESTER PRINTING PLATE

Edward C. Yackel, Pittsford, and Donald P. Foster, Hilton, N.Y. (both % Kodak Park Works, Rochester, N.Y. 14650)

Filed June 19, 1970, Ser. No. 47,707
Int. Cl. G03f 7/02
U.S. Cl. 96—33
1 Sheet Drawing. 11 Pages Specification

Preparation of lithographic printing plates by coating a substantially fully esterified cellulose organic acid ester support with a hydrophilic unhardened, tannable colloid layer such as gelatin containing light sensitive silver halide, exposing the sensitive colloid layer to a subject, developing the exposed layer with a tanning developing agent, heating the developed layer in alkaline hydrolyzing solution at a temperature of about 110° F. to 150° F. to hydrolyze areas on the cellulose organic ester support and form on said support an image corresponding to said subject and removing the colloid layer from said support.

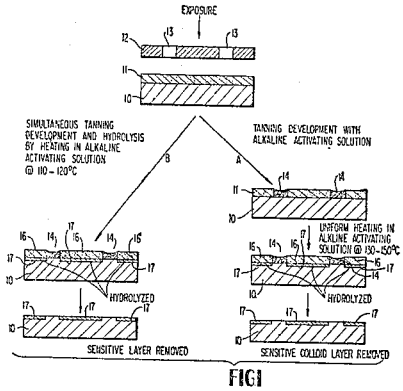

FIG1

In a preferred aspect of the invention, the heating of the developed layer is effected by infrared radiation.

Jan. 26, 1971 E. C. YACKEL ET AL T882,023

METHOD OF MAKING A HYDROLYZED CELLULOSE ESTER PRINTING PLATE

Filed June 19, 1970

INVENTORS
EDWARD CARL YACKEL
DONALD PAUL FOSTER

BY Henry E. Byers
ATTORNEYS